(12) United States Patent
Minzoni

(10) Patent No.: US 6,943,604 B2
(45) Date of Patent: Sep. 13, 2005

(54) DEVICE AND METHOD FOR CORRECTING THE DUTY CYCLE OF A CLOCK SIGNAL

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/834,385

(22) Filed: Apr. 29, 2004

(65) Prior Publication Data

US 2004/0257134 A1 Dec. 23, 2004

(30) Foreign Application Priority Data

Apr. 30, 2003 (DE) .......................................... 103 20 794

(51) Int. Cl.[7] .............................................. H03K 3/017
(52) U.S. Cl. ................................................... 327/175
(58) Field of Search ......................... 327/170, 172–176, 327/291–296, 298, 233, 237, 35

(56) References Cited

U.S. PATENT DOCUMENTS

| | | | |
|---|---|---|---|
| 5,120,990 A | | 6/1992 | Koker .......................... 327/2 |
| 5,757,218 A | * | 5/1998 | Blum .......................... 327/175 |
| 5,777,567 A | | 7/1998 | Murata et al. .............. 341/100 |
| 6,181,178 B1 | * | 1/2001 | Choi ........................... 327/175 |
| 6,448,828 B2 | * | 9/2002 | Stark et al. .................. 327/175 |
| 6,525,581 B1 | * | 2/2003 | Choi ........................... 327/175 |
| 6,654,900 B1 | * | 11/2003 | Cave ........................... 713/501 |

* cited by examiner

Primary Examiner—My-Trang Nu Ton
(74) Attorney, Agent, or Firm—Morrison & Foerster LLP

(57) ABSTRACT

A device for correcting the duty cycle of a clock signal with a duty cycle modifying device which receives a clock signal and a complementary clock signal, which comprises a delay device for both clock signals, and which is adapted to generate a clock signal and a complementary clock signal with corrected duty cycle. The invention also relates to a corresponding method for correcting the duty cycle of a clock signal and may preferably be used to correct the duty cycle of the system clock input in a DDR-SDRAM device in order that an ideal duty cycle of 50 percent is achieved in the memory chip during the processing thereof to a data strobe. As compared to previous similar devices and methods, the invention thus enables, with DDR-SDRAM devices, a more precise reading out of the data from the devices to the system associated with the devices.

13 Claims, 7 Drawing Sheets distorted clock signal corrected clock signal with duty cycle 50 percent

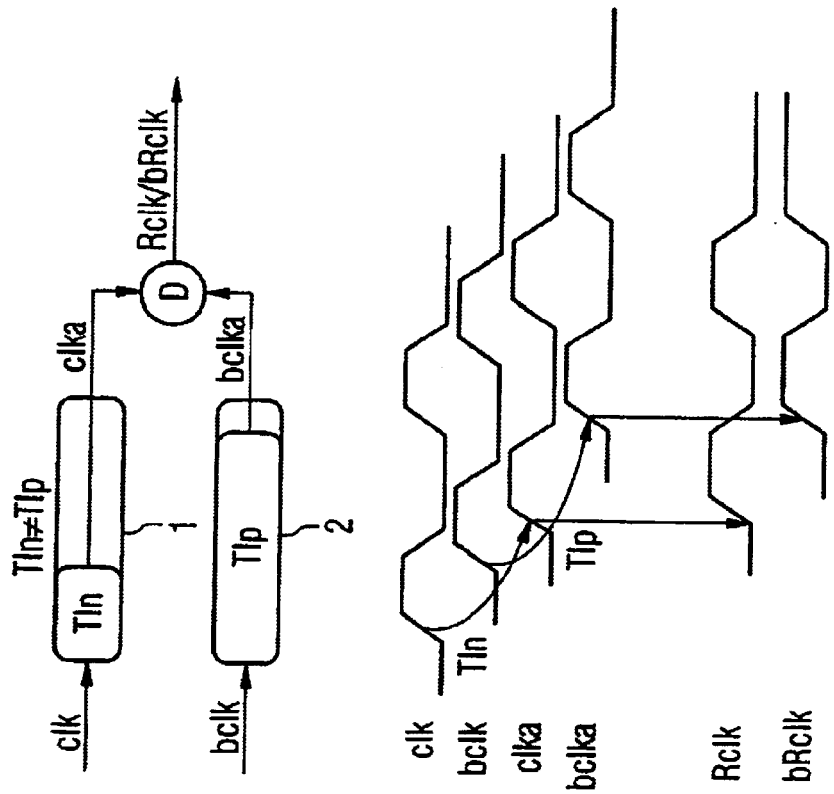
FIG 4 PRIOR ART
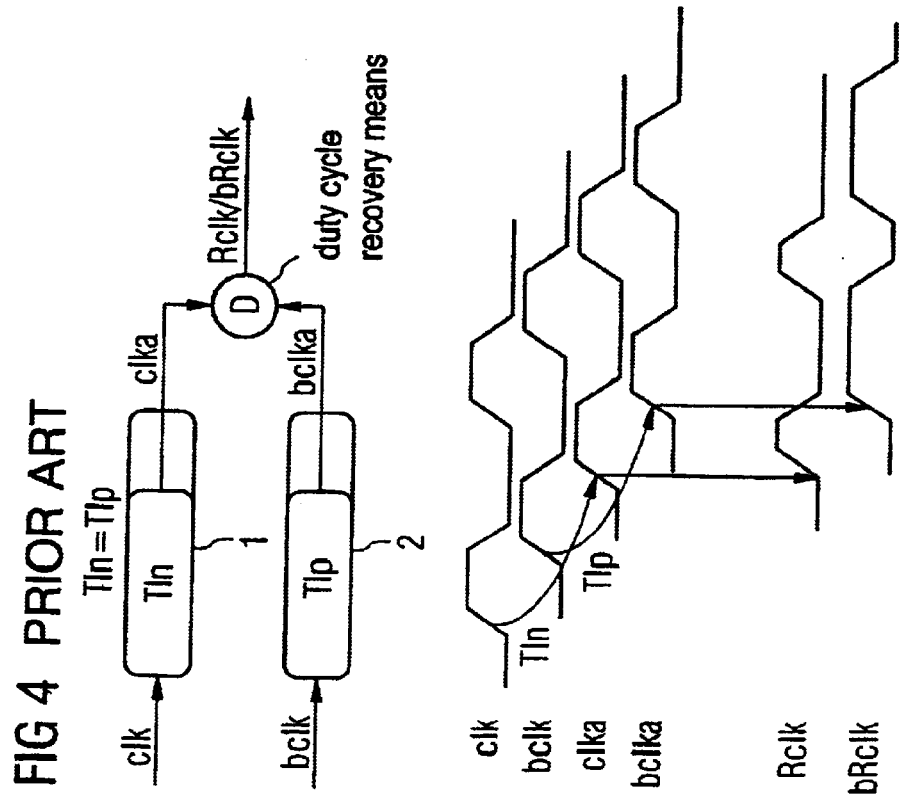

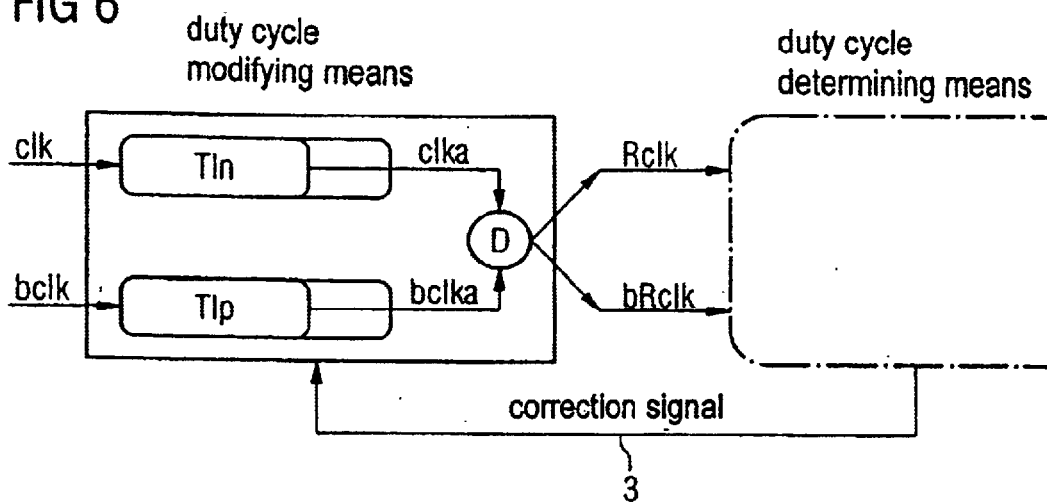
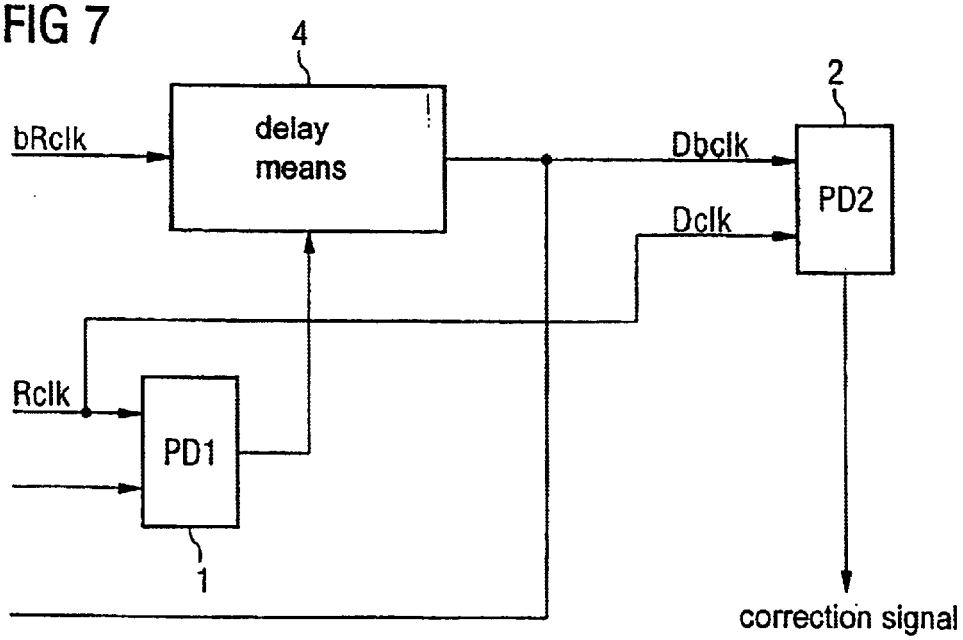

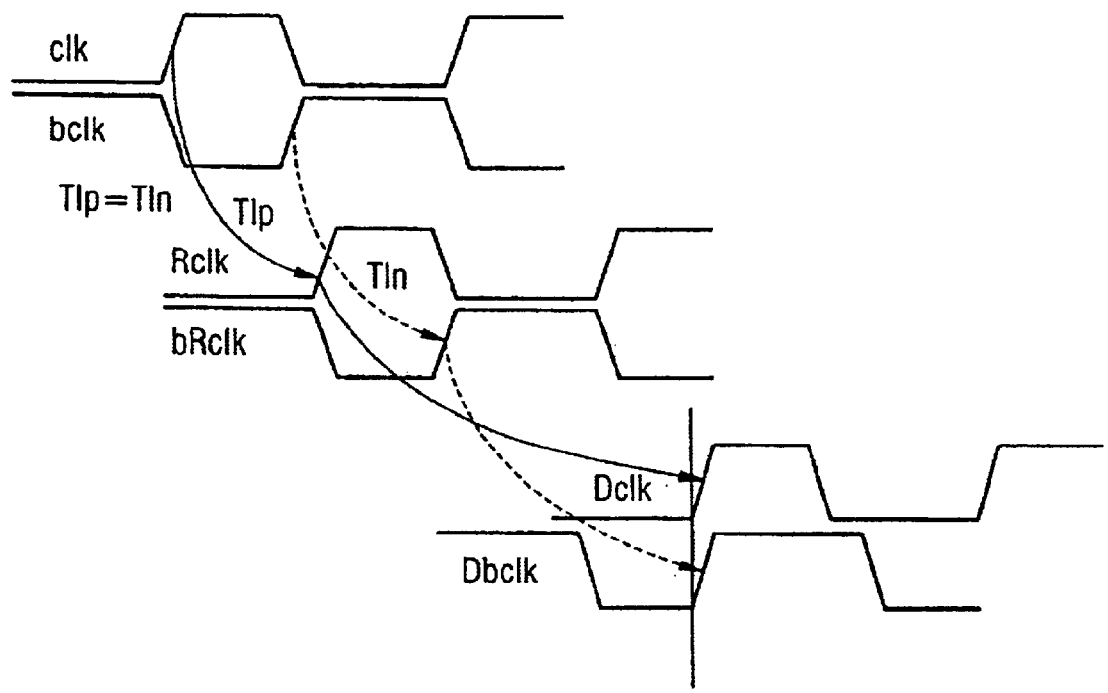

DEVICE AND METHOD FOR CORRECTING THE DUTY CYCLE OF A CLOCK SIGNAL

CLAIM FOR PRIORITY

This application claims the benefit of priority to German Application No. 103 20 794.5, filed in the German language on Apr. 30, 2003, the contents of which are hereby incorporated by reference.

TECHNICAL FIELD OF THE INVENTION

The present invention relates to a device and a method for correcting the duty cycle of a clock signal.

BACKGROUND OF THE INVENTION

Synchronous dynamic semiconductor memories with random access (SDRAM), and in particular SDRAM with double data rate (DDR-SDRAM) output, during reading out, their data (for which the abbreviation "DQ" is used) synchronously to a clock signal output by the memory. This clock signal, which is also referred to as data strobe and is usually abbreviated as "DQS", in turn has to be synchronous to a clock signal (CLK) input externally in the memory. The external clock signal is generated by devices connected with the memory and communicating therewith and conveying the read instruction to the memory, said devices being, to facilitate matters, referred to as "system" in the following. The system may, for instance, consist of a processor. To the external clock signal CLK or the strobe signal DQS, respectively, there are simultaneously also generated respective complementary signals that are referred to as BCLK or BDQS, respectively. FIG. 1 shows an SDRAM with the above-explained non-complementary signals CLK and DQS and the data signal DQ. FIG. 2 illustrates in a time flowchart the external clock signal (CLK) with its complementary (BCLK), the data strobe (DQS) with its complementary (BDQS), and the data signal (DQ) together with the synchronization between data strobe and data signal, and the synchronization between data strobe and external clock signal.

The DDR-SDRAM-memories comprise a device for synchronizing the data strobe (DQS) generated from the external clock signal with the external clock signal (CLK), and a device for correcting the duty cycle of the clock signal predetermined by the system. The duty cycle correcting device works with the object of generating, from the external clock, a clock on the DRAM chip with a duty cycle of 0.5, even when an imprecise external clock signal exists which has a duty cycle deviating therefrom. This is because the duty cycle predetermined by the system clock frequently does not concur with the desired duty cycle of 0.5, which may, for instance, be caused by fluctuations in the supply voltage, the process temperature, or the external load of the chip. The duty cycle here means the relation between the H-level duration of the clock signal and the clock period, wherein the duty cycle, with semiconductor memories with double data rate in which one data bit is addressed with the rising clock edge and one with the falling clock edge, should have a value of 0.5, so that the time window for reading out the data, the so-called data eye, which is created by the overlapping of corresponding logic states of data strobe and data signal, becomes as large as possible and ensures a reliable reading out of the data from the memory chip to the system.

FIG. 3 illustrates a comparison between a distorted and a corrected clock signal. FIG. 3a shows an external clock signal CLK, BCLK with a distorted duty cycle larger than 50 percent since the duration of the H-level (th) exceeds the duration of the L-level (tl). FIG. 3b shows a data strobe DQS, BDQS gained from the distorted clock signal CLK, BCLK, with a duty cycle of 50 percent, wherein th=tl.

Known devices for correcting the duty cycle of a clock signal, such as they are, for instance, described in German patent application No. 102 14 304.8, consist, as a rule, of two elements, a duty cycle determining means and a duty cycle modifying means that receives an external clock signal with a particular, as a rule faulty, duty cycle, is capable of modifying the duty cycle as a function of a correction signal supplied by the duty cycle determining means, and outputs a clock signal with a corrected duty cycle which may, for instance, be used as data strobe in an SDRAM. The principle of the known devices for correcting the duty cycle is explained in FIGS. 4 and 5.

FIG. 4 shows the functioning of the duty cycle modifying means. The duty cycle modifying means receives the external clock signal CLK and delays same by means of a first delay means 1 by a certain value T1$n$, so that a delayed clock signal CLKA results, which is also illustrated in the time flowchart in FIG. 4 at the left bottom. Likewise, the complementary clock signal BCLK is delayed by means of a second delay means 2 by a certain value T1$p$, so that a delayed clock signal BCLKA results, which is also illustrated in FIG. 4 at the left bottom. The delays T1$n$ and T1$p$ of the two delay means 1 and 2 are variably adjustable via a correction signal supplied by the duty cycle determining means (cf. FIG. 5). The two delayed clock signals CLKA and BCLKA are fed to a duty cycle recovery means D which is also described in the above-mentioned patent application and works such that it generates a clock signal and a complementary clock signal with a corrected duty cycle (RCLK or BRCLK, respectively) by producing, with a rising edge of the clock signal CLKA, a rising edge of the clock signal RCLK and a falling edge of the clock signal BRCLK, and with a rising edge of the clock signal BCLKA, a falling edge of the clock signal RCLK and a rising edge of the clock signal BRCLK, which can be seen in FIG. 4 at the bottom. In the left portion of FIG. 4, the case where the two delay times T1$n$ and T1$p$ are equal is illustrated for explanation, so that the clock signals RCLK and BCLK have a duty cycle that differs from 50 percent and is thus not ideal. In FIG. 4, on the contrary, the case is illustrated in which the duty cycle determining means has found that the actual duty cycle of CLK and BCLK differs from 50 percent (i.e. 0.5), so that a correction signal was sent to the delay means, thereby modifying the delay times T1$n$ and T1$p$, so that clock signals RCLK and BCLK with a modified duty cycle result, which now corresponds to the ideal value of 50 percent.

FIG. 5 illustrates the principle of a known duty cycle determining means. The determination of the duty cycle is, in particular with frequencies of e.g. 300 MHz and above, very difficult since with such high frequencies the time difference between the H-level duration th and the L-level duration tl may be in the range of some Pico seconds. In the case of the known duty cycle determining means illustrated in FIG. 5, two controllable switches are used, one of which being controlled via the external clock signal (CLK), and the second one being controlled via the inverted external clock signal (BCLK), each of them being connected with an identical current source which may, for instance, consist of a MOS-FET. Both current sources are adapted to be connected via one of the respective switches with a capacitor.

On actuation of the switch that is actuated by an H-level of the non-inverted clock signal the capacitor is charged, and on actuation of the other switch that is actuated by an H-level of the inverted clock signal the capacitor is discharged. The voltage resulting at the capacitor after a clock period is then a measure for displacements of the duty cycle in the one or the other direction. This principle is illustrated in FIG. 5, where the first switch is designated with sA, the second switch with sB, the first current source with Ia, the second current source with Ib, the capacitor with C, the voltage at the capacitor with Vc, and the voltage at the capacitor after a clock period with Vc(Tp). As can be recognized from the time flowchart on the right in FIG. 5, the balance between charging and discharging results in a voltage at the capacitor which is a measure for a displacement of the duty cycle from the ideal value of 50 percent. This voltage may now be used as a correction signal for controlling the variable time delays of the delay means of the duty cycle modifying means illustrated in FIG. 4.

The known duty cycle determining means described in connection with FIG. 5 does, however, comprise a number of drawbacks. Thus, the current sources and switches have to be manufactured in a relatively expensive manner, i.e. by making use of a relatively large layout region, to achieve the desired exactness. Moreover, it is relatively difficult to manufacture two current sources that are exactly identical in their behavior since certain deviations result by fluctuations during the manufacturing of semiconductors. The same applies to the switches sA and sB which also have to be exactly identical. Finally, the courses of the charging and discharging curves illustrated in FIG. 5 are not exactly linear, so that further undesired deviations will result.

SUMMARY OF THE INVENTION

The invention relates to a device and method for correcting the duty cycle of a clock signal, the device and method comprising advantages vis-à-vis previous devices and methods.

In one embodiment of the invention, there is a device for correcting the duty cycle of a clock signal with a duty cycle modifying device that receives a clock signal whose duty cycle is to be corrected, and a clock signal complementary to said clock signal, wherein the duty cycle modifying device comprises a delay device for each the clock signal and the complementary signal, by means of which a variable delay of the corresponding clock signal can be adjusted, and wherein the duty cycle modifying device is adapted to generate, at the output, a clock signal with corrected duty cycle and a complementary clock signal with corrected duty cycle, and by a duty cycle determining device that receives the clock signal with corrected duty cycle and the complementary clock signal with corrected duty cycle from the duty cycle modifying device and examines them, and that is adapted to generate a correction signal that indicates whether the current duty cycle of the clock signal with corrected duty cycle and of the complementary clock cycle with corrected duty cycle deviates from a predetermined desired duty cycle, wherein the correction signal controls the delay device of the duty cycle modifying device such that the variable delays are adjusted such that the desired duty cycle is achieved, and wherein the duty cycle determining device comprises an orientation device and a difference determining device, wherein the orientation device is designed such that it is adapted to orientate the rising or falling edges of the clock signal with corrected duty cycle and of the complementary clock signal with corrected duty cycle such that they coincide in time, and to feed the orientated clock signals (non-complementary and complementary) with corrected duty cycle to the difference determining device that is designed such that it is adapted to determine whether there is a time difference between the durations of the H-levels or the L-levels of the orientated clock signals, so that, in the case of a difference, a corresponding correction signal can be sent to the delay device of the duty cycle modifying device.

In another embodiment of the invention, there is a method for correcting the duty cycle of a clock signal, wherein a clock signal whose duty cycle is to be corrected, and a clock signal complementary to the clock signal are received, the clock signal and the complementary clock signal each are delayed by a variably adjustable delay time, a clock signal with corrected duty cycle and a complementary clock signal with corrected duty cycle are generated from the delayed clock signals, the clock signal with corrected duty cycle and the complementary clock signal with corrected duty cycle are displaced in time vis-à-vis one another such that the rising or falling edges of the clock signal with corrected duty cycle and of the complementary clock signal with corrected duty cycle are orientated such that they coincide in time, wherein it is determined by means of the clock signals orientated in time whether there is a difference in time between the durations of the H-levels or the L-levels of the clock signals, and, in case a difference was detected, a corresponding correction signal is generated by means of which the variably adjustable delay times of the clock signal and of the complementary clock signal are adjusted such that the duty cycle of the clock signal with corrected duty cycle reaches a desired predetermined value.

BRIEF DESCRIPTION OF THE DRAWINGS

Embodiments of the invention will be explained in detail in the following with reference to the drawings and the description. The drawings show:

FIG. 4 shows schematically a method for duty cycle modification used in prior art.

FIG. 6 shows a block diagram of an embodiment of a device for correcting the duty cycle of a clock signal in accordance with the invention.

FIG. 7 shows a block diagram of a duty cycle determining device that is used in the embodiment of the device for correcting the duty cycle of a clock signal in accordance with the invention as illustrated in FIG. 6.

FIG. 8 shows a time flowchart for explaining the functioning of the duty cycle determining means illustrated in FIG. 7 of the embodiment of the device for correcting the duty cycle of a clock signal in accordance with the invention as illustrated in FIG. 7.

DETAILED DESCRIPTION OF THE INVENTION

Figure 1:
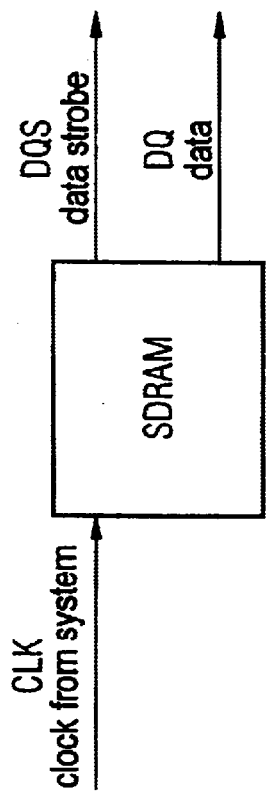
FIG. 1 shows a prior art SDRAM with the input and output signals of the SDRAM that are important for explaining the invention.

FIG. 6 illustrates a block diagram of an embodiment of a device for correcting the duty cycle of a clock signal in accordance with the invention. The device according to the invention comprises a duty cycle modifying device illustrated on the left in FIG. 6, and a duty cycle determining means illustrated schematically as a block on the right in FIG. 6.

The duty cycle modifying device used with the described embodiment is known from prior art and has already been described above, so that it will be dealt with only briefly here. The duty cycle modifying device receives, from outside the chip on which the device for correcting the duty cycle of a clock signal in accordance with the invention is located, an external clock signal CLK and a clock signal BCLK complementary thereto. These clock signals may, for instance, be received by a chip that is connected with the chip on which the device in accordance with the invention is located. The external chip which will, to simplify matters, be referred to as "system" in the following, may, for instance, be a processor chip, while the chip on which the device for correcting the duty cycle of a clock signal in accordance with the invention is located is to be the chip of a DDR-SDRAM-memory in the instant embodiment.

The duty cycle of the received system clock CLK, BCLK should—as described above—ideally be 50 percent for the correct reading out of the DDR-SDRAM-memory. This ideal duty cycle of the system clock may be impaired by certain effects, for instance by fluctuations in the supply voltage. The deviations of the system clock may also be increased by so-called receivers that may be used on the memory chip to receive and process the clock signals CLK and BCLK coming in from the system. Such receivers are, for instance, also described in the initially mentioned patent application and e.g. in EP 964 517. The receivers are also used to convert differential input clock signals to single-ended clock signals generated on the memory chip, and to perform level adaptations. In this case, two receivers would be employed, comprising input signals CLK and BCLK that are respectively exchanged with respect to one another.

The duty cycle modifying device illustrated in FIG. 6 comprises a first delay means 1 in which the received clock signal CLK can be deliberately delayed by a certain adjustable delay time T1n. The adjustment of the delay time may be performed via a control signal that is externally applied to the delay device 1 and that will be referred to as "correction signal" in the following and is generated by the duty cycle determining device illustrated on the right in FIG. 6 and is transferred to the first delay device 1 via a connection 3.

The duty cycle modifying device illustrated in FIG. 6 moreover comprises a second delay device 2 in which the received complementary clock signal BCLK can be deliberately delayed by a certain adjustable delay time T1p. The adjustment of the delay time may also be performed via a control signal that is externally applied to the delay device 1 and that will be referred to as "correction signal" in the following and is generated by the duty cycle determining device illustrated on the right in FIG. 6 and is transferred to the second delay device 2 via a connection 3.

In FIG. 6, the two delay times T1n and T1p are illustrated such that they are of identical duration. This, of course, need not necessarily be the case, as will be shown in the following.

The delayed clock signal CLKA and the delayed complementary clock signal BCLKA are fed to a duty cycle recovery device D which functions such that it generates, by means of the rising edges of the delayed clock signal CLKA and the delayed complementary clock signal BCLKA, a clock signal RCLK with corrected duty cycle and a clock signal BRCLK with corrected duty cycle complementary thereto. In this embodiment, the duty cycle recovery device D functions such that, when a rising edge of the delayed clock signal CLKA occurs, a rising edge of the clock signal RCLK and a falling edge of the clock signal BRCLK is generated, and, when a rising edge of the delayed complementary clock signal BCLKA occurs, a falling edge of the clock signal RCLK and a rising edge of the complementary clock signal BRCLK is generated.

Generally, a duty cycle recovery element may also be used, wherein, when an edge of a first kind of the delayed clock signal CLKA occurs, an edge of the first kind of the clock signal RCLK with corrected duty cycle and an edge of a second kind of the complementary clock signal BRCLK with corrected duty cycle is generated, and, when an edge of the first kind of the delayed complementary clock signal BCLKA occurs, an edge of the second kind of the clock signal RCLK with corrected duty cycle and an edge of the first kind of the complementary clock signal BRCLK with corrected duty cycle is generated.

A time flowchart of the above-explained clock signals CLK, BCLK, CLKA, BCLKA, RCLK, and BRCLK may be taken from FIG. 4 since there exists, in this respect, no difference between the prior art and the device or the method in accordance with the invention.

The duty cycle determining device used in the embodiment of the device for correction of the duty cycle of a clock signal in accordance with the invention as illustrated in FIG. 6 is shown in FIG. 7. The duty cycle determining device comprises a delay device 4 which receives the complementary clock signal BRCLK with corrected duty cycle from the duty cycle modifying device and delays same by a certain, variably adjustable amount of time. The clock signal DBCLK resulting therefrom is transferred to an input of a first phase detector PD1 which receives, at its other input, the clock signal RCLK with corrected duty cycle. The first phase detector PD1 outputs a control signal to the delay device 4, by which the variable delay time is adjusted such that the rising edges of the delayed clock signal DBCLK and of the transferred clock signal RCLK, which is then referred to as DCLK, are orientated in time with respect to one another, which is illustrated in FIG. 8 in a time flowchart at the bottom. The first function of the duty cycle determining device includes orientating the rising edges of the clock signals RCLK and BRCLK received from the duty cycle modifying device with respect to one another. Of course, this is only one example of a useful orientation. In another embodiment, the falling edges might, for instance, also be orientated with respect to one another.

FIG. 8 illustrates how the clock signals RCLK and BRCLK are generated by the duty cycle modifying device from the incoming clock signals CLK and BCLK (assuming identical delays T1p and T1n for illustration purposes), and how these are then converted, by the delay device 4 and the first phase detector PD1, to two clock signals DCLK and DBCLK whose rising clock signal edges have been synchronized in time with respect to one another, which is illustrated by the vertical line in FIG. 8. It may be recognized that the duty cycle deviates from the desired duty cycle of 50 percent since the duration of the H-level of the signal DBCLK exceeds the duration of the H-level of the signal DCLK. The process of correction of the duty cycle has thus not yet been terminated at that point in time and has to be continued.

FIG. 7 reveals that the orientated clock signals DBCLK and DCLK are now fed to a second phase detector 2 which reacts to falling clock edges and by means of which it can be detected easily (cf. in this respect FIG. 9 top) whether the lengths of the H-levels of the clock signals DBCLK and DCLK deviate from one another with respect to time. Instead of the phase detector 2, a phase frequency detector or some other device suited to detect a difference between the H-level lengths of the two clock signals DBCLK and DCLK might also be used.

Figure 9:
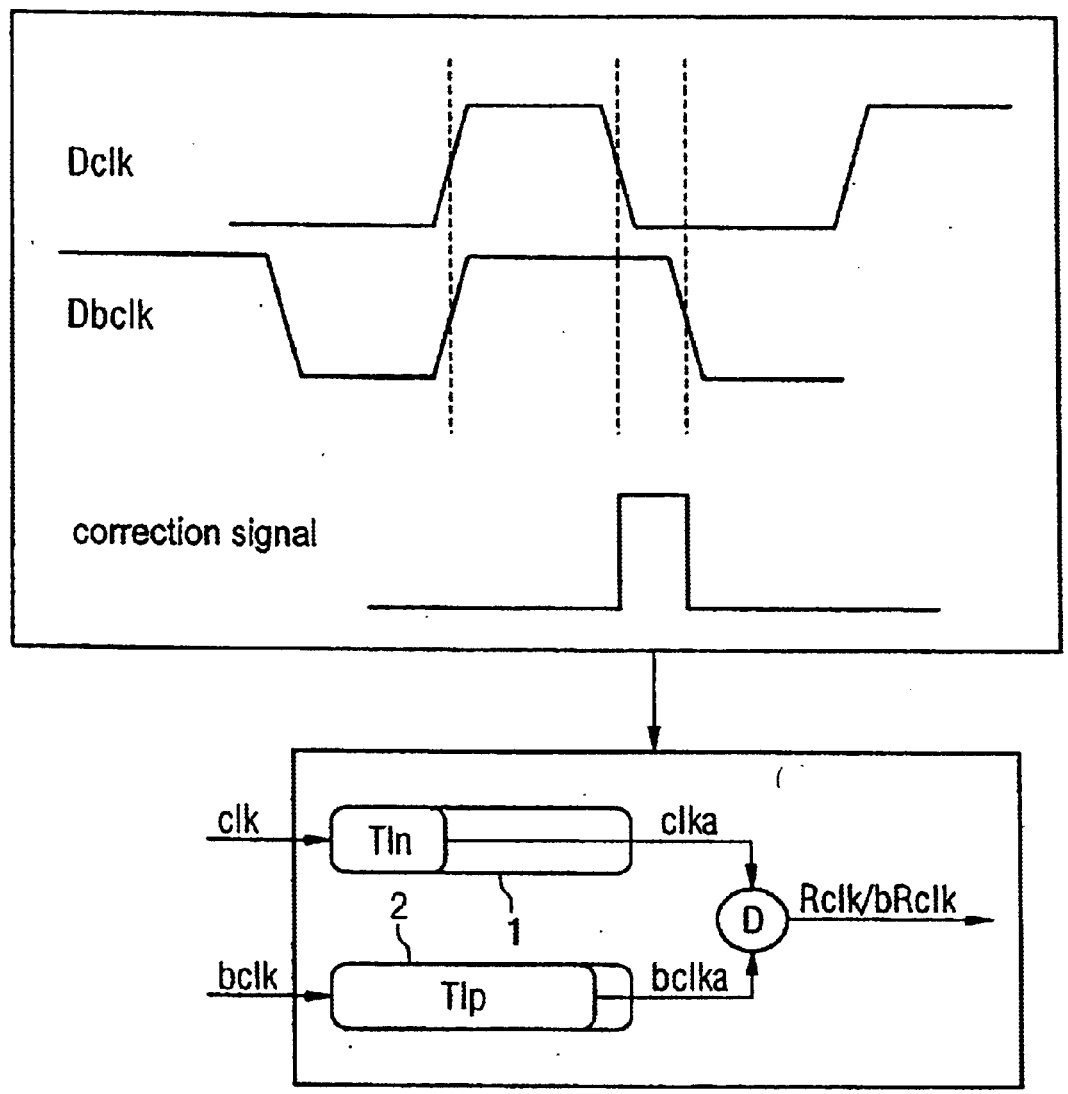
FIG. 9 shows diagrams for explaining the functioning of the duty cycle determining means illustrated in FIG. 7.

The second phase detector PD2 then outputs a correction signal at its output, which—as is shown in FIG. 9—is used to adjust the delay times T1n and T1p of the delay device 1 and 2 of the duty cycle modifying device such that the signals RCLK and BRCLK have an ideal duty cycle, as it is, for instance, illustrated at the right bottom in FIG. 4.

In the case of digital realization of the circuit, the phase detector PD2 may, for instance, only output a simple correction signal which only differentiates digitally whether the cycle still deviates from 50 percent, and in which direction the delay times have to be modified. The delay times are then modified by a predetermined step, and a comparison is again performed via the phase detector PD2 so as to detect whether deviations from the ideal duty cycle can still be found. If this is the case, the described proceeding is repeated until an ideal duty cycle has been adjusted.

Figure 2:
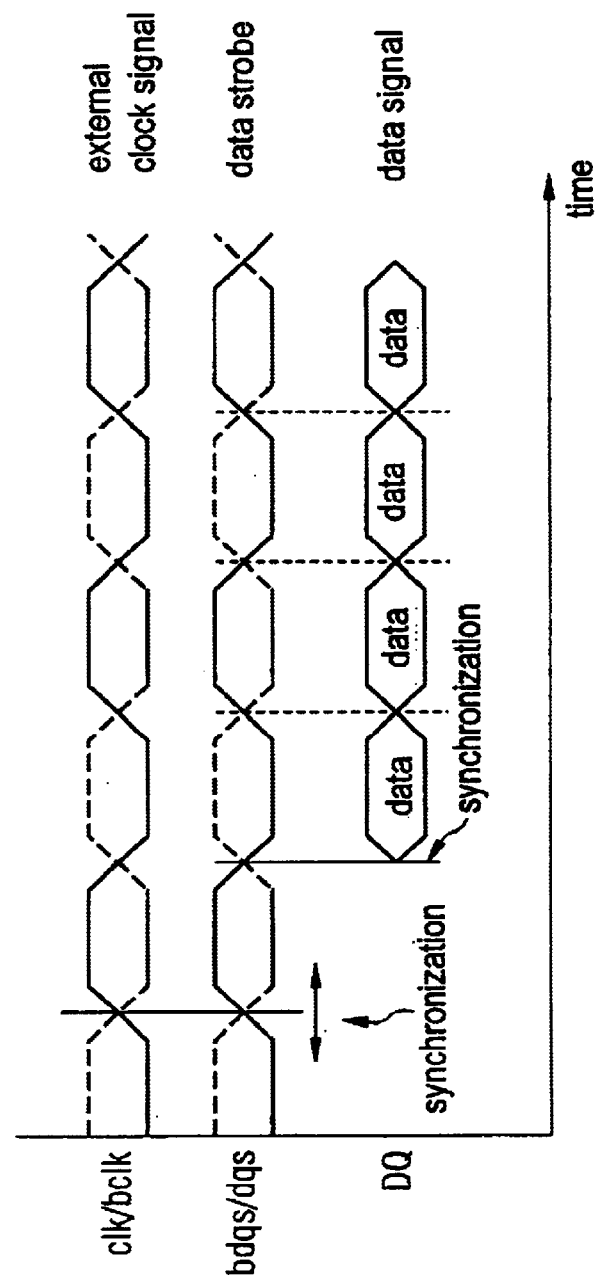
FIG. 2 shows time flowcharts of the input and output signals illustrated in FIG. 1 for illustrating the synchronization of these signals.
Figure 3A:
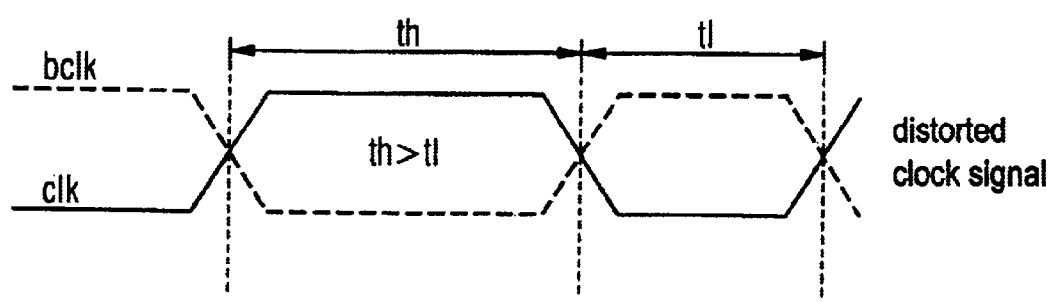
FIG. 3 shows a comparison between a distorted external clock signal and a data strobe with corrected duty cycle.
Figure 3B:
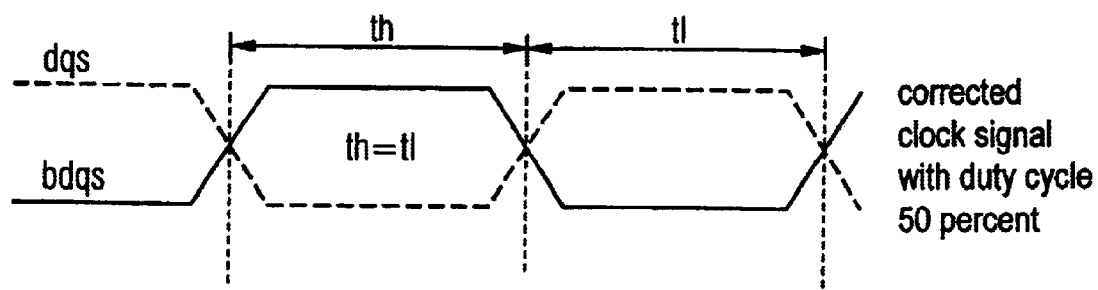
Figure 5:
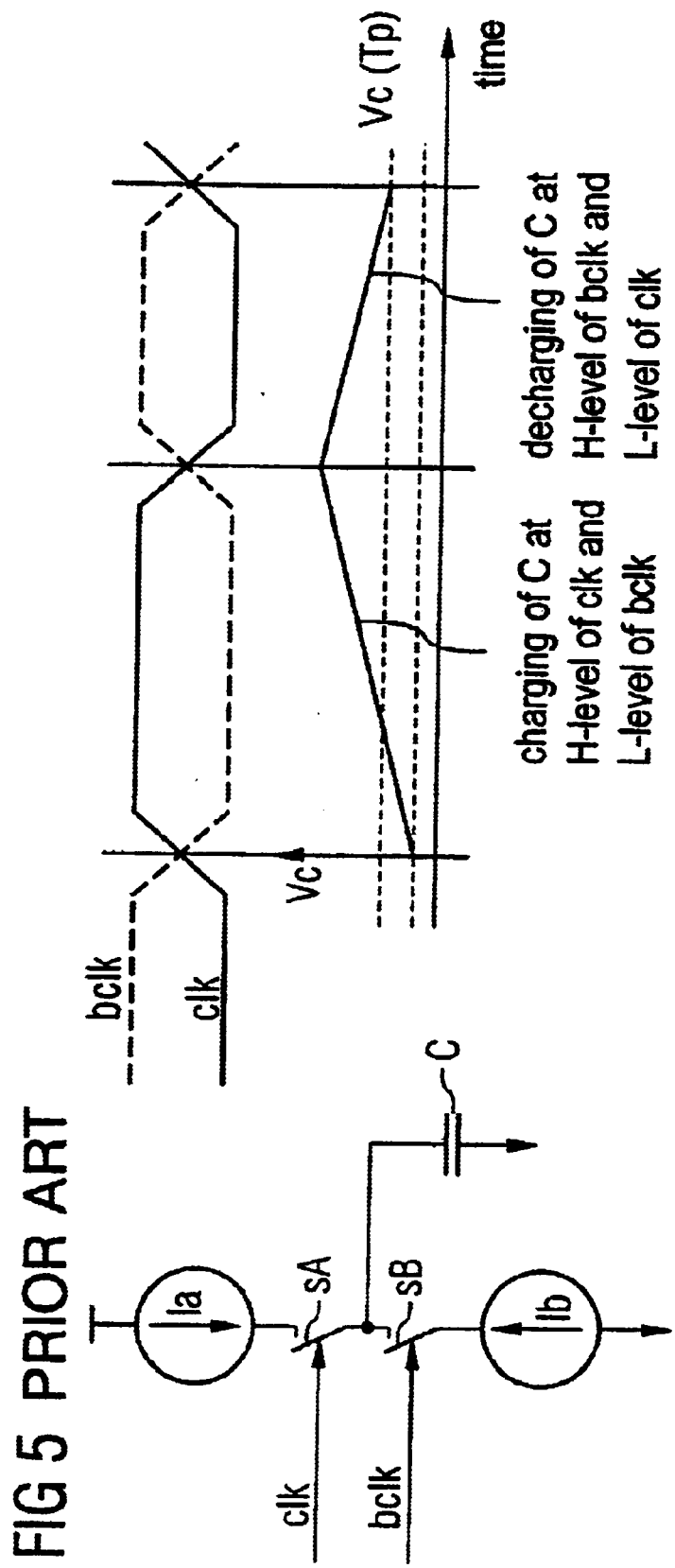
FIG. 5 shows schematically a method for duty cycle determination used in prior art.

The output clock signals RCLK und BRCLK with ideal duty cycle may then be used to form, for instance, the data strobe DQS (or BDQS, respectively) of a DDR-SDRAM-device, as is illustrated in FIGS. 1 and 2.

The embodiments of the invention as described may, of course, be modified in various ways.

The invention thus provides a simple and reliable device that is easy to implement, as well as a corresponding method, for correcting the duty cycle of a clock signal.

Instead of the second phase detector PD2 which reacts to falling clock signal edges, some other "difference determining device" may also be used which is designed such that it is adapted to determine whether a difference in time exists between the durations of the H-levels or of the L-levels of the clock signals DCLK and DBCLK. A means that exactly determines the value of the difference may, for instance, also be used.

It is pointed out that the terms "clock signal with corrected duty cycle" for the clock signal RCLK and "complementary clock signal with corrected duty cycle" for the clock signal BRCLK are, of course, adequate when the device is in a "steady state" of the two control loops (duty cycle determining device and duty cycle modifying device) in which an ideal duty cycle of 50 percent results. However, before this state has been reached, a "clock signal with corrected duty cycle" actually cannot yet be spoken of since the duty cycle has not yet been corrected completely. These two terms will therefore have to be understood in the light of this definition.

The term "duty cycle determining device" finally must not be understood such that it is absolutely necessary that the duty cycle is determined exactly with this device. The term is to include any device that is merely capable of generating a correction signal that represents the information of whether there exists a deviation of the duty cycle of the current clock signal from the ideal duty cycle, and in which direction a correction has to be performed.

What is claimed is:

1. A device for correcting the duty cycle of a clock signal, comprising:
 a duty cycle modifying device receiving a clock signal whose duty cycle is to be corrected, and a clock signal complementary to the clock signal, wherein the duty cycle modifying device comprises:
  a delay device for the clock signal and the complementary clock signal by which a variable delay of the corresponding clock signal can be adjusted, and wherein the duty cycle modifying device is adapted to generate at an output a clock signal with corrected duty cycle and a complementary clock signal with corrected duty cycle; and
 a duty cycle determining device that receives the clock signal with corrected duty cycle and the complementary clock signal with corrected duty cycle from the duty cycle modifying device and examines the clock signals, and adapts the clock signals to generate a correction signal that indicates whether the current duty cycle of the clock signal with corrected duty cycle and of the complementary clock signal with corrected duty cycle deviates from a predetermined desired duty cycle,
 wherein the correction signal controls the delay device of the duty cycle modifying device such that the variable delays are adjusted such that the desired duty cycle is achieved, and
 wherein the duty cycle determining device comprises:
  an orientation device and a difference determining device, with the orientation device being designed such that it is adapted to orientate the rising or falling edges of the clock signal with corrected duty cycle and of the complementary clock signal with corrected duty cycle such that they coincide in time, and to feed the orientated clock signals with corrected duty cycle to the difference determining device which is designed such that it is adapted to determine whether there is a difference in time between the durations of the H-levels or of the L-levels of the orientated clock signals, so that, in the case of a difference, a corresponding correction signal can be sent to the delay device of the duty cycle modifying device.

2. The device according to claim 1, wherein the difference determining device includes a phase detector or a phase frequency detector.

3. The device according to claims 1, wherein the orientation device comprises a phase detector and a delay device with variable delay which receives the complementary clock signal with corrected duty cycle from the duty cycle modifying device and outputs a delayed complementary clock signal with corrected duty cycle to the difference determining device and to the phase detector which compares the clock signal with respect to phases with the clock signal with corrected duty cycle received from the duty cycle modifying device and which outputs at the output a signal with variable delay to the delay device, by means of which the delay of the complementary clock signal with corrected duty cycle is corrected such that the rising or falling edges of the clock signal with corrected duty cycle output by the orientation device to the difference determining device and of the delayed clock signal with corrected duty cycle are orientated in time with respect to one another.

4. The device according to claim 1, the device being designed in a form of an integrated circuit.

5. The device according to claim 4, wherein the received clock signal and the received complementary clock signal originate from a processor connected with the integrated circuit.

6. The device according to claim 1, wherein the desired predetermined duty cycle is 50 percent.

7. The device according to claim 1, wherein the duty cycle modifying device comprises a duty cycle recovery device that is connected to follow the delay device, the duty cycle recovery device being designed such that, when an edge of a first delayed clock signal occurs, an edge of the first clock signal with recovered duty cycle and an edge of a second complementary clock signal with recovered duty cycle is generated and, when an edge of the first delayed complementary clock signal occurs, an edge of the second clock signal with recovered duty cycle and an edge of the first complementary clock signal with recovered duty cycle is generated.

8. A semiconductor memory, comprising: a device having a duty cycle modifying device receiving a clock signal whose duty cycle is to be corrected, and a clock signal complementary to the clock signal, wherein the duty cycle modifying device comprises:

a delay device for the clock signal and the complementary clock signal by which a variable delay of the corresponding clock signal can be adjusted, and wherein the duty cycle modifying device is adapted to generate at an output a clock signal with corrected duty cycle and a complementary clock signal with corrected duty cycle; and a duty cycle determining device that receives the clock signal with corrected duty cycle and the complementary clock signal with corrected duty cycle from the duty cycle modifying device and examines the clock signals, and adapts the clock signals to generate a correction signal that indicates whether the current duty cycle of the clock signal with corrected duty cycle and of the complementary clock signal with corrected duty cycle deviates from a predetermined desired duty cycle, wherein the correction signal controls the delay device of the duty cycle modifying device such that the variable delays are adjusted such that the desired duty cycle is achieved, and wherein the duty cycle determining device comprises:

an orientation device and a difference determining device, with the orientation device being designed such that it is adapted to orientate the rising or falling edges of the clock signal with corrected duty cycle and of the complementary clock signal with corrected duty cycle such that they coincide in time, and to feed the orientated clock signals with corrected duty cycle to the difference determining device which is designed such that it is adapted to determine whether there is a difference in time between the durations of the H-levels or of the L-levels of the orientated clock signals, so that, in the case of a difference, a corresponding correction signal can be sent to the delay device of the duty cycle modifying device.

9. The semiconductor memory according to claims 8, the semiconductor memory being a DDR-SDRAM.

10. The semiconductor memory according to claim 8, the semiconductor memory including a receiver by means of which the clock signal and the complementary clock signal are received on the chip of the semiconductor memory.

11. A method for correcting the duty cycle of a clock signal, comprising:

correcting a clock signal whose duty cycle and receiving a clock signal complementary to the clock signal, the clock signal and the complementary clock signal delayed by a variably adjustable delay time;

generating a clock signal with corrected duty cycle and a complementary clock signal with corrected duty cycle from the delayed clock signals, the clock signal with corrected duty cycle and the complementary clock signal with corrected duty cycle are displaced in time vis-à-vis one another such that rising or falling edges of the clock signal with corrected duty cycle and of the complementary clock signal with corrected duty cycle are orientated such that they coincide in time;

detecting using the clock signals orientated in time whether a time difference exists between durations of H-levels or of L-levels of the clock signals, and if a difference is detected, a corresponding correction signal is generated such that the variably adjustable delay times of the clock signal and of the complementary clock signal are adjusted such that the duty cycle of the clock signal with corrected duty cycle reaches a desired predetermined value.

12. The method according to claim 11, wherein, during generation of the clock signal with corrected duty cycle and the complementary clock signal with corrected duty cycle, when an edge of a first delayed clock signal occurs, an edge of the first clock signal with corrected duty cycle and an edge of a second complementary clock signal with corrected duty cycle is generated and, when an edge of the first delayed complementary clock signal occurs, an edge of the second clock signal with corrected duty cycle and an edge of the first complementary clock signal with corrected duty cycle is generated.

13. The method according to claim 11, wherein the desired predetermined duty cycle is 50 percent.

* * * * *